United States Patent
Yanagida et al.

(10) Patent No.: US 6,660,665 B2
(45) Date of Patent: Dec. 9, 2003

(54) PLATEN FOR ELECTROSTATIC WAFER CLAMPING APPARATUS

(75) Inventors: Hiroaki Yanagida, Tokyo (JP); Hideaki Matsubara, Nagoya (JP); Yoshiki Okuhara, Aichi (JP); Shoji Aoki, Aichi (JP); Naoki Kawashima, Nagoya (JP); Bruce T. Williams, Lockport, NY (US); Toshio Uehara, Tokyo (JP)

(73) Assignees: Japan Fine Ceramics Center, Nagoya (JP); Trek Japan K.K., Tokyo (JP); Trek, Inc., Medina, NY (US)

( * ) Notice: Subject to any disclaimer, the term of this patent is extended or adjusted under 35 U.S.C. 154(b) by 12 days.

(21) Appl. No.: 10/137,790

(22) Filed: May 1, 2002

(65) Prior Publication Data

US 2003/0207596 A1 Nov. 6, 2003

(51) Int. Cl.$^7$ .......................... H02N 13/00; H01L 21/31; H01L 21/00
(52) U.S. Cl. ...................... 438/800; 361/230; 361/233; 361/235; 361/234; 438/780; 428/209
(58) Field of Search .................. 438/780, 800; 361/234, 230, 233, 235; 428/209, 210, 692, 698, 67; 427/63, 580, 540; 414/935; 269/903, 21

(56) References Cited

U.S. PATENT DOCUMENTS

| | | | | |
|---|---|---|---|---|
| 3,772,748 A | * | 11/1973 | Rutt ......................... 29/25.42 |
| 4,816,072 A | * | 3/1989 | Harley et al. ........... 106/287.18 |
| 5,691,876 A | * | 11/1997 | Chen et al. ................. 361/234 |
| 5,754,391 A | * | 5/1998 | Bates ......................... 361/234 |
| 5,969,934 A | * | 10/1999 | Larsen ....................... 361/234 |
| 6,272,002 B1 | * | 8/2001 | Mogi et al. ................. 361/234 |
| 6,399,143 B1 | * | 6/2002 | Sun et al. ................ 427/72.14 |

* cited by examiner

Primary Examiner—Matthew Smith
Assistant Examiner—V. Yevsikov
(74) Attorney, Agent, or Firm—Hodgson Russ LLP

(57) ABSTRACT

A platen for electrostatic wafer clamping apparatus comprising a platen body of dielectric material and grains of electrically conductive material diffused in the dielectric material so that the platen has a relatively large electrostatic capacitance due to the diffusion of the conductive grains with the result that the platen provides an increased clamping force regardless of humidity. In accordance with another aspect of the invention, the thickness of the platen body can be decreased by an amount sufficient to maintain a constant clamping force with reduced applied voltage, to eliminate any residual voltage on the platen and to increase the speed of wafer release. The grains of electrically conductive material are present in an amount of from about 2.5 percent to about 15.0 percent of the volume of the platen body, and the grains of electrically conductive material are selected from the group consisting of carbonated transition metals, nitrified transition metals and carbonated grains. The dielectric material preferably is $Al_2O_3$, and the grains of electrically conductive material preferably are TiC and preferably in an amount of about 5% of the volume of the platen.

18 Claims, 15 Drawing Sheets

FIG. 3 (a) TiC 2.5%

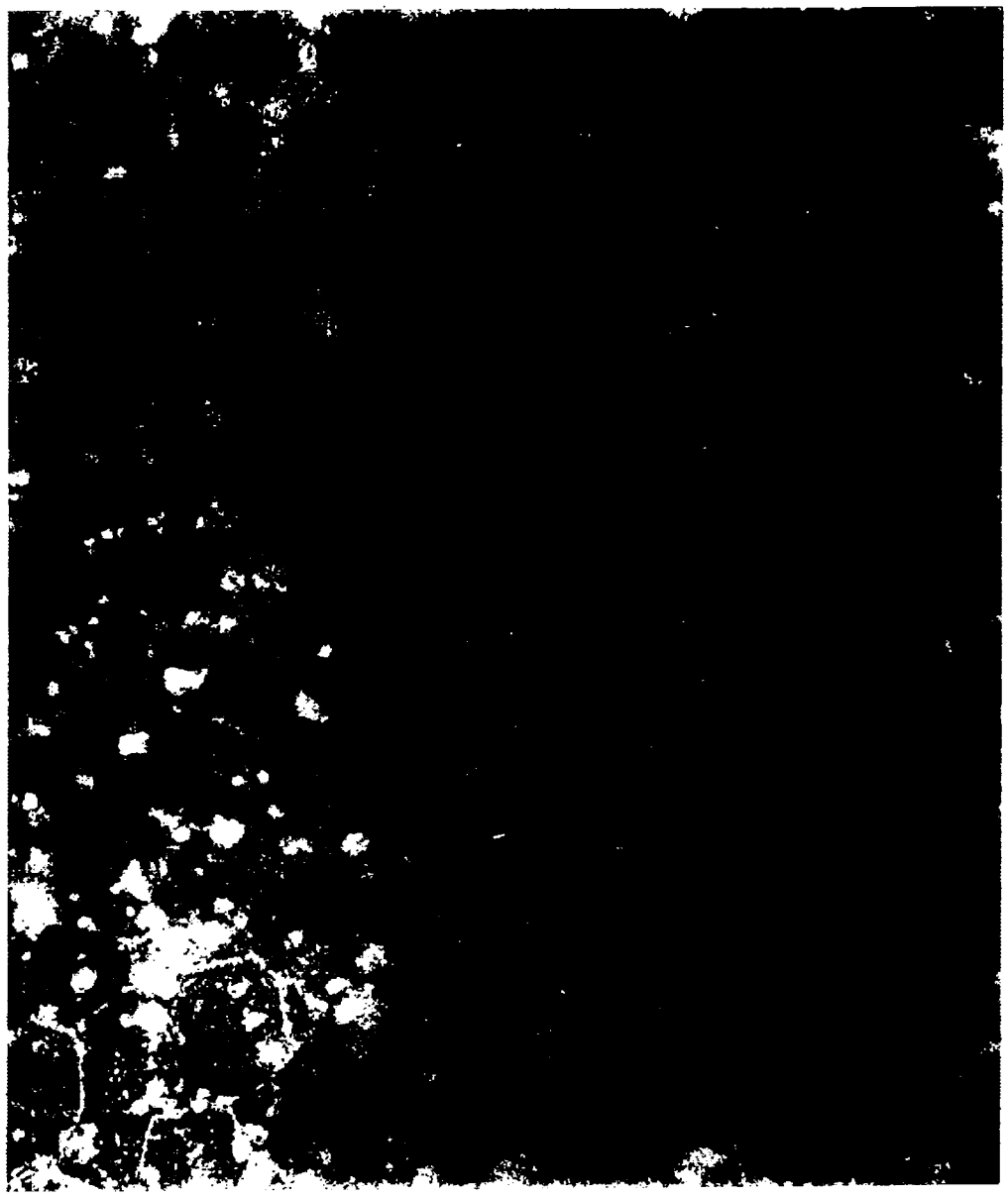
FIG. 3 (b) TiC 5.0%

FIG. 3 (c) TiC 10.0%

FIG. 3 (d) TiC 15.0%

ELECTRICAL CHARACTERISTICS OF $Al_2O_3$ - TiC COMPOSITES

| SAMPLE | RESISTIVITY / Ω·cm | THICKNESS / mm | DIELECTRIC CONSTANT(ε) | | | DIELECTRIC LOSS (tan δ) | | |
|---|---|---|---|---|---|---|---|---|
| | | | 100Hz | 1kHz | 1MHz | 100MHz | 1kHz | 1MHz |
| TiC 2.5% | $3.6 \times 10^{11}$ | 0.511 | 11.4 | 11.3 | 11.2 | -29.5 | 3.3 | $<1 \times 10^{-3}$ |
| TiC 5% | $7.3 \times 10^{12}$ | 0.509 | 12.7 | 12.7 | 12.5 | -675.0 | 7.03 | $<1 \times 10^{-3}$ |
| TiC 10% | $9.5 \times 10^{12}$ | 0.510 | 18.3 | 18.1 | 17.9 | 801.2 | 11.4 | $2 \times 10^{-3}$ |
| TiC 15% | $3.9 \times 10^{6}$ | 0.509 | 59.2 | 53.3 | 53.2 | 25.3 | 41.8 | $15 \times 10^{-3}$ |

FIG. 4

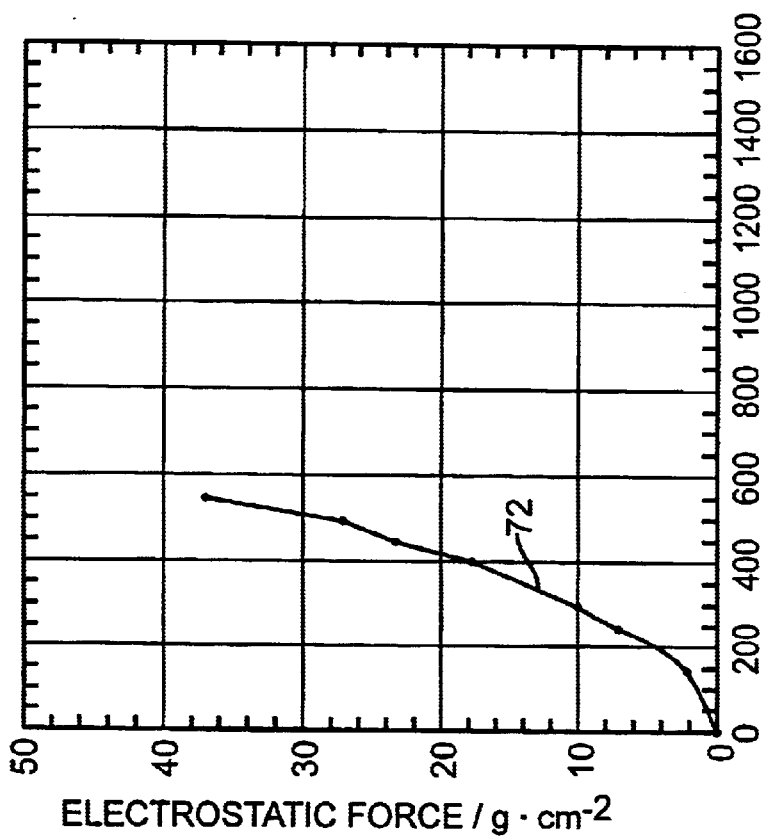
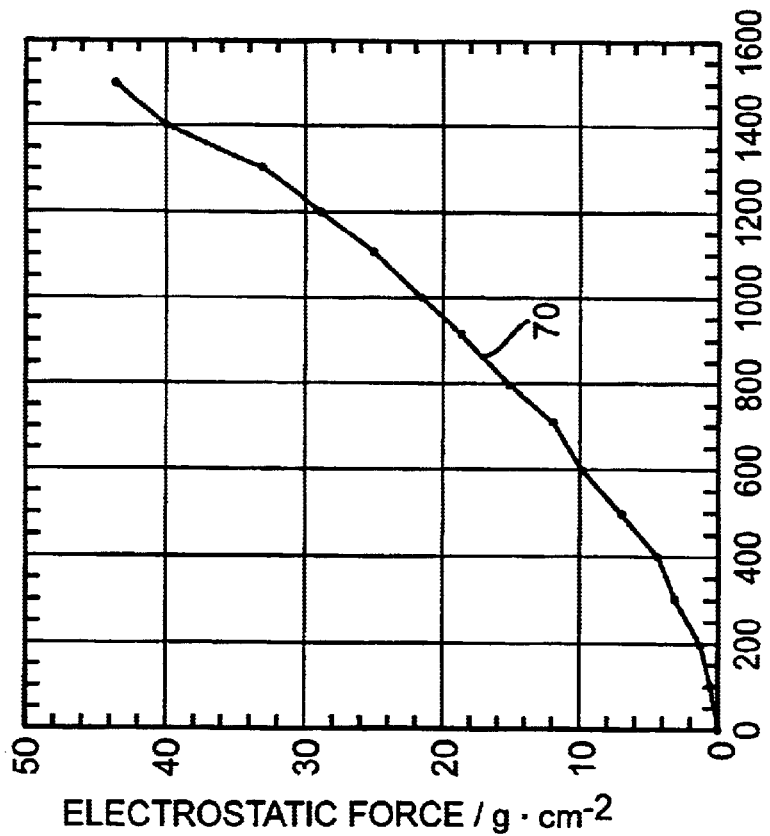
FIG. 7(b)
FIG. 7(a)

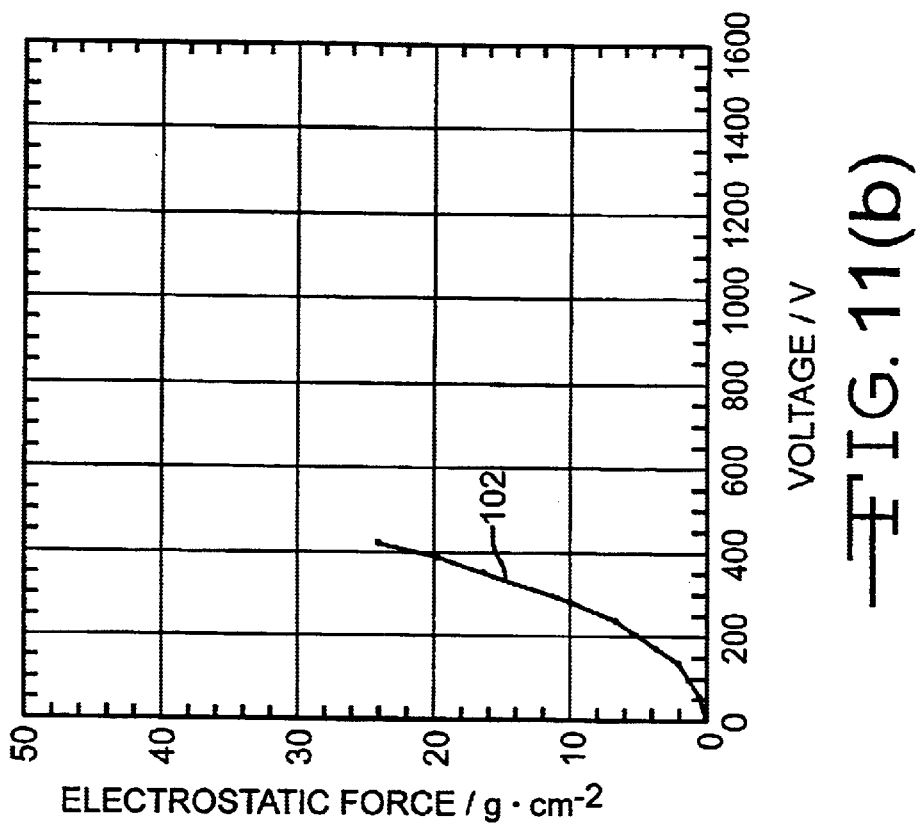
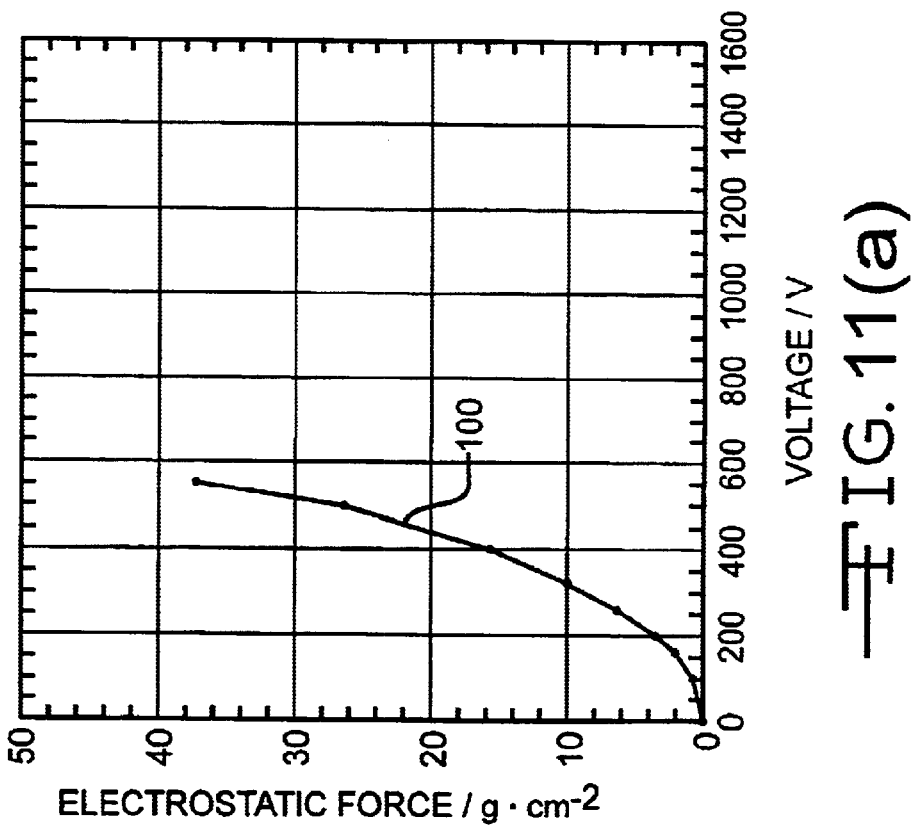

PLATEN FOR ELECTROSTATIC WAFER CLAMPING APPARATUS

BACKGROUND OF THE INVENTION

This invention relates to the art of manufacturing semiconductor devices, and more particularly to a new and improved platen for electrostatic wafer-clamping apparatus used in the manufacture of semiconductor devices.

A known technique for clamping semiconductor wafers during manufacture involves the use of electrostatic chucks. Although electrostatic chucks vary in design, they all are based upon the same physical principles, namely, the creation of an electrostatic force between a platen surface and a semiconductor wafer. Typical electrostatic chucks include an electrically conductive electrode that is mounted on a pedestal and covered by an electrically insulative, dielectric material or platen. The semiconductor wafer seats on top of the insulative material. A voltage source electrically biases the electrode so that electric charge accumulates in the electrode and the insulative material. The applied voltage then induces an equal and opposite charge on the rear surface of the wafer. This accumulated electric charge generates an electrostatic force that attracts and clamps the wafer against the insulative material or platen. Then while the semiconductor wafer is clamped various processes can be employed on the wafer such as chemical vapor deposition, ion implantation, ion beam milling and reactive ion etching.

An important consideration in the design of platens for electrostatic chucks is increasing the electrostatic clamping force. Another important consideration is maintaining high clamping force irregardless of environmental conditions. Still another important consideration is allowing for increased speed of release of the water from the electrostatic chuck once the manufacturing operations on the clamped water have been completed.

SUMMARY OF THE INVENTION

The present invention provides a platen for electrostatic wafer clamping apparatus comprising a platen body of dielectric material and grains of electrically conductive material diffused in the dielectric material so that the platen has a relatively large electrostatic capacitance due to the diffusion of the conductive grains with the result that the platen provides an increased clamping force regardless of humidity. In accordance with another aspect of the present invention, the thickness of the platen body can be decreased by an amount sufficient to maintain a constant clamping force with reduced applied voltage, to eliminate any residual voltage on the platen and to increase the speed of water release. The grains of electrically conductive material are present in an amount of from about 2.5 percent to about 15.0 percent of the volume of the platen body, and the grains of electrically conductive material are selected from the group consisting of carbonated transition metals, nitrified transition metals and carbonated grains. The dielectric material preferably is $Al_2O_3$, and the grains of electrically conductive material preferably are TiC and preferably in an amount of about 5% of the volume of the platen.

The foregoing and additional advantages and characterizing features of the present invention will become clearly apparent upon a reading of the ensuing detailed description together with the included drawing.

BRIEF DESCRIPTION OF THE DRAWING FIGURES

Figure 5:
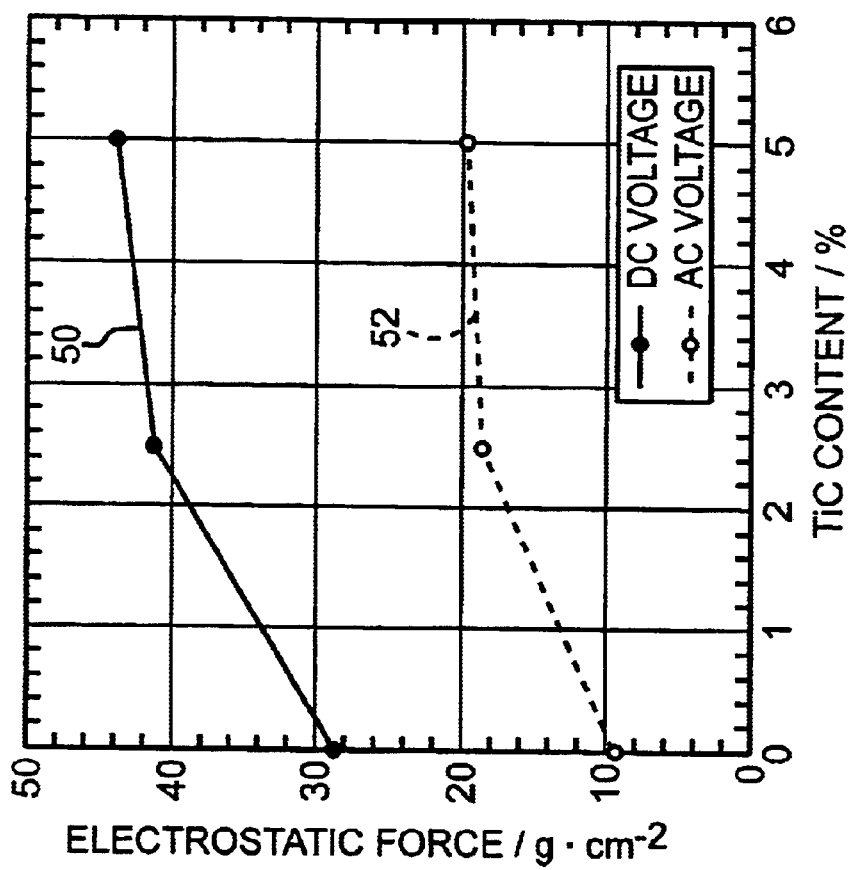
Figure 6B:
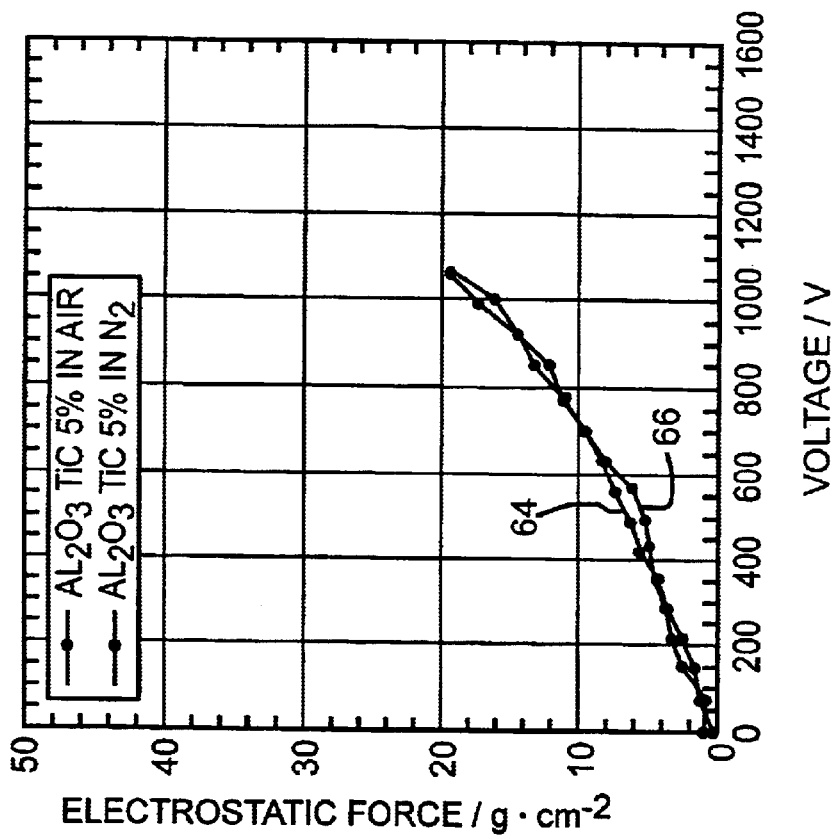
Figure 6A:
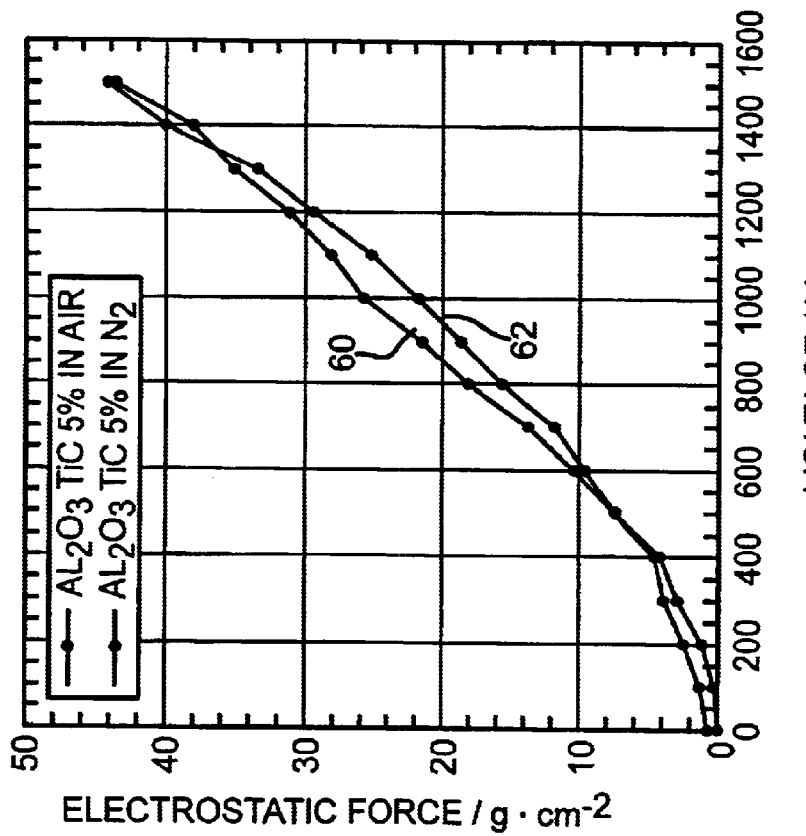
Figure 8A:
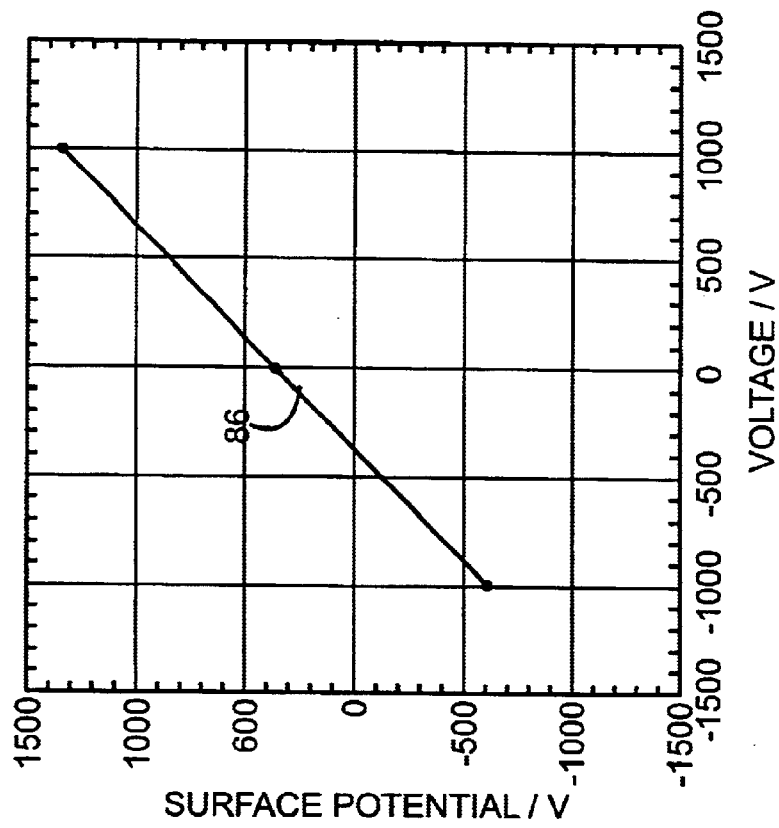
Figure 8B:
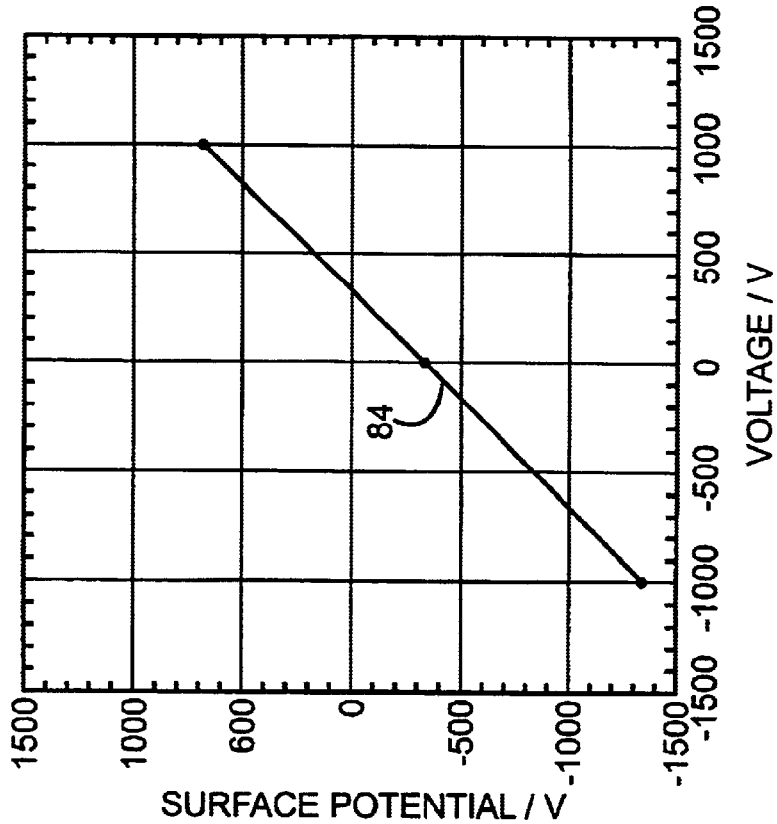
Figure 9A:
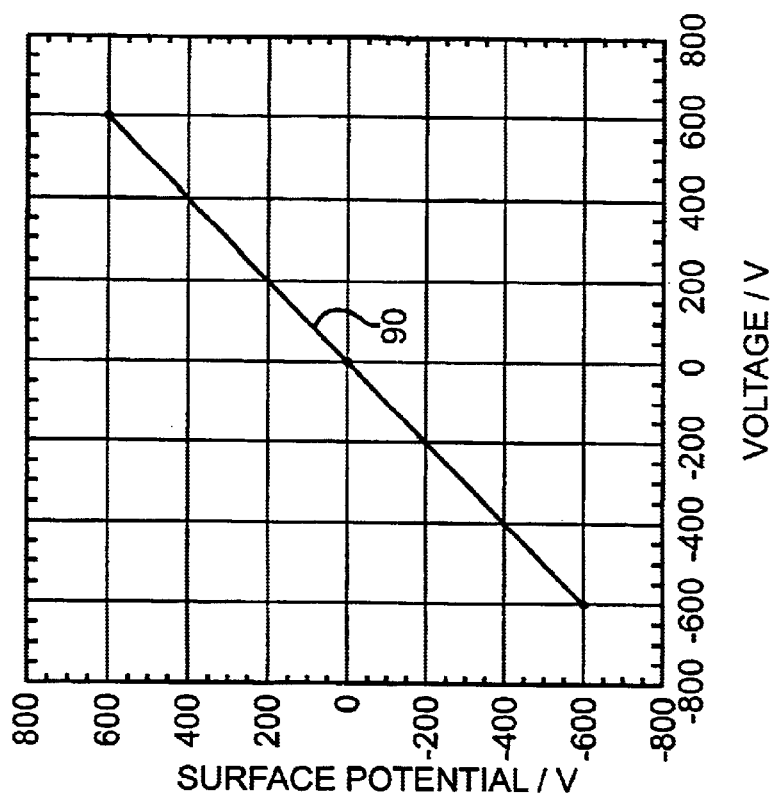
Figure 9B:
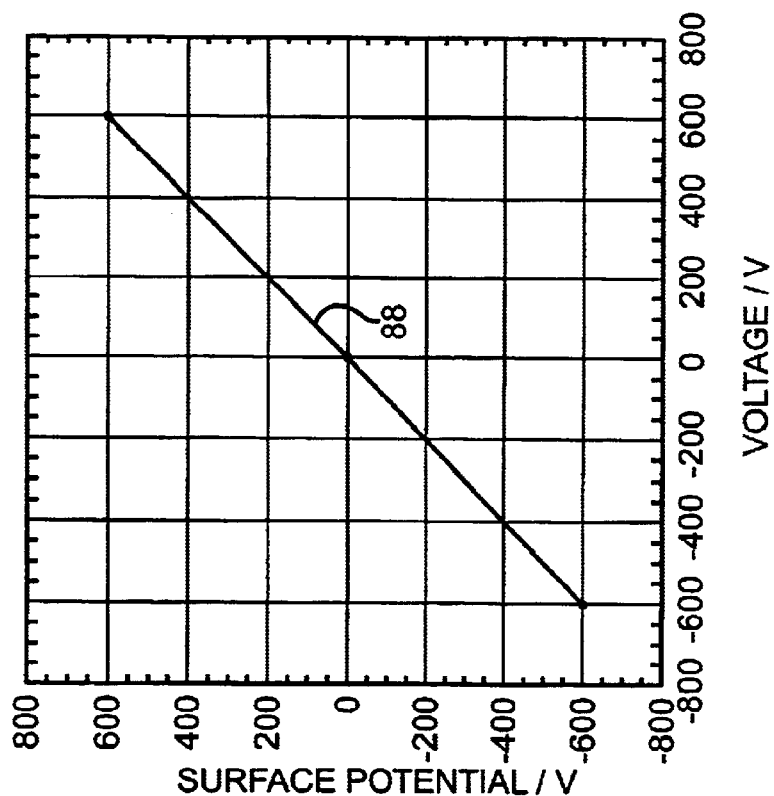
Figure 10B:
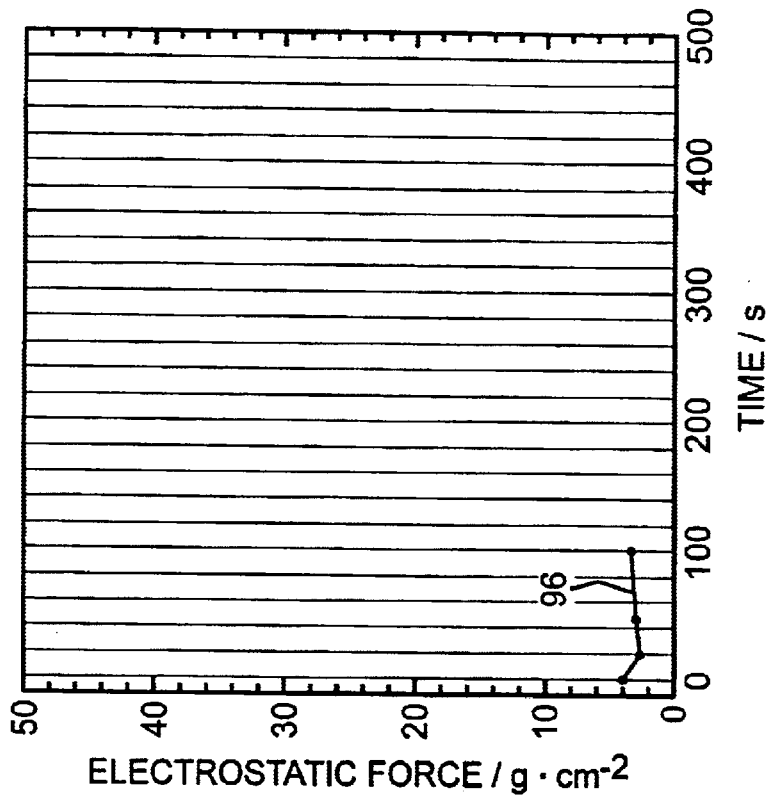
Figure 10A:
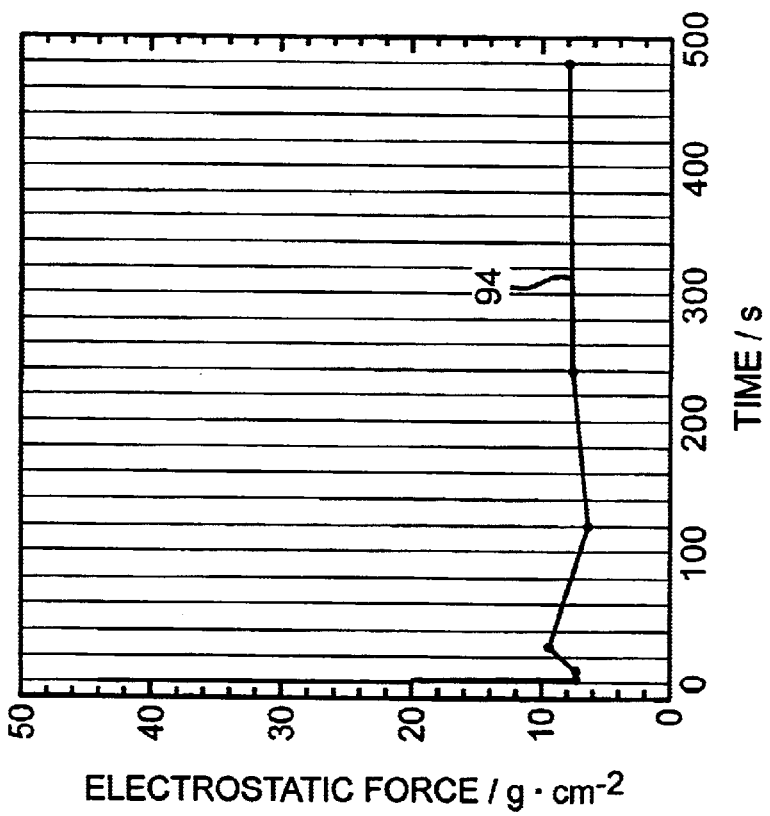
Figure 12B:
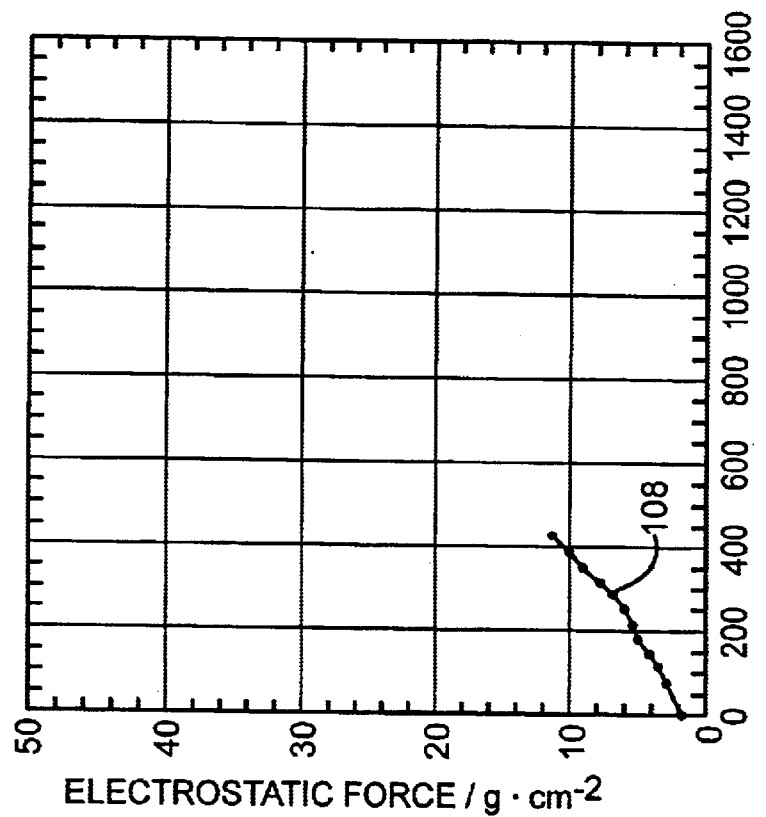
Figure 12A:
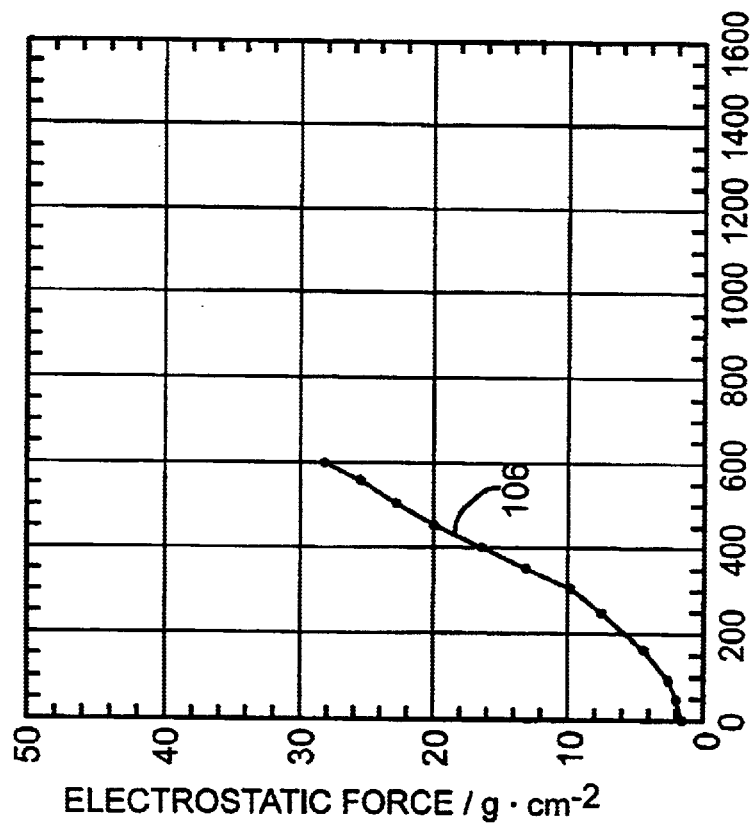
Figure 13:
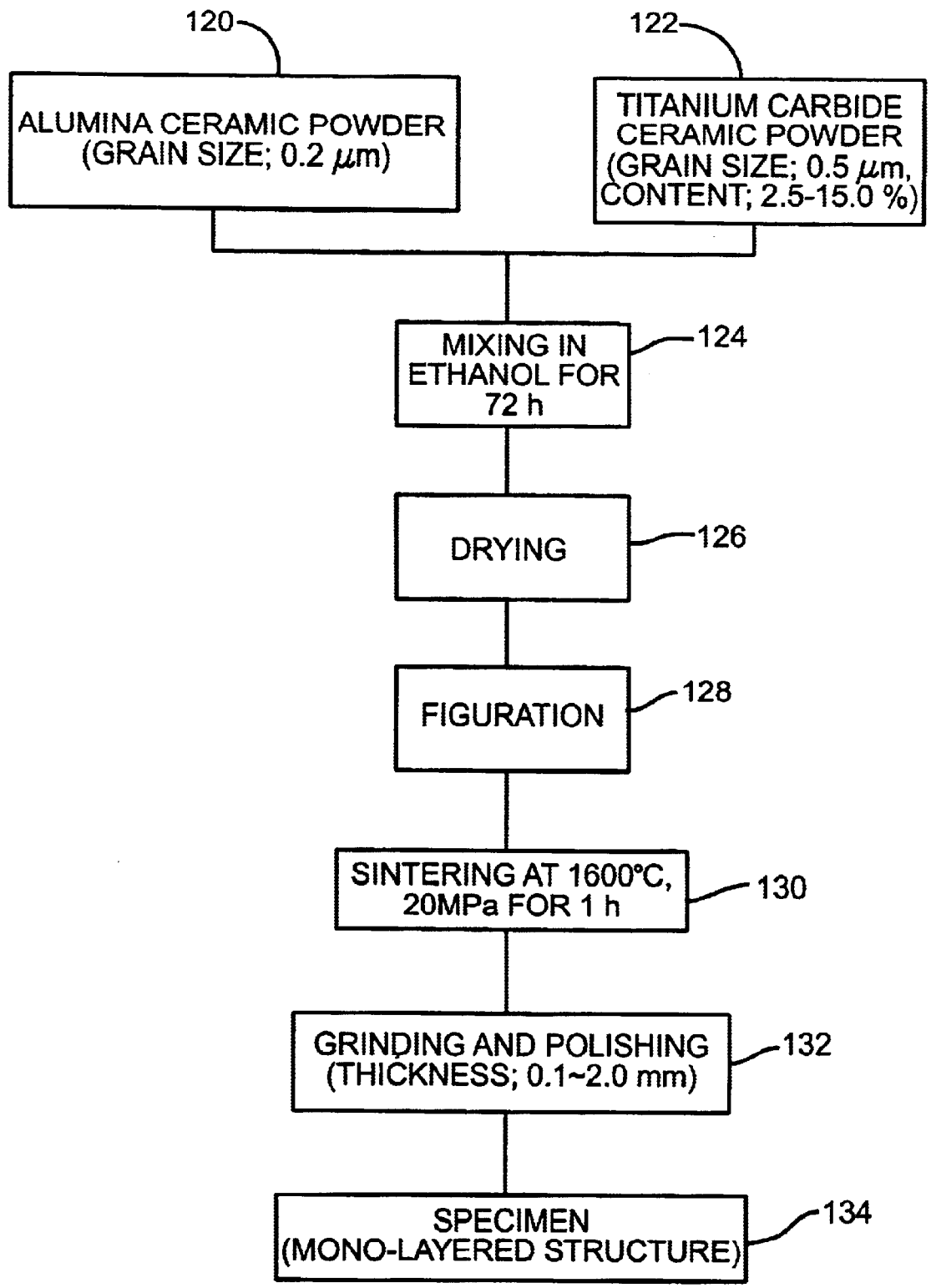

FIGS. 3(a)–3(d) are scanning electron microscope photographs illustrating the material of the electrostatic chuck platen according to the present invention;

FIG. 4 is a table presenting electrical characteristics of the material of the electrostatic chuck material of the present invention;

FIG. 5 is a graph of electrostatic force characteristics of the material of the electrostatic chuck platen of the present invention;

FIGS. 6(a) and 6(b) are graphs of electrostatic force as a function of applied voltage further illustrating the electrostatic chuck platen of the present invention;

FIGS. 7(a) and 7(b) are graphs of electrostatic force as a function of applied voltage for two different thicknesses of the platen of the resent invention;

FIGS. 8(a) and 8(b) are graphs of surface potential as a function of applied voltage further illustrating the electrostatic chuck platen of the present invention;

FIGS. 9(a) and 9(b) are graphs like those of FIGS. 8(a) and 8(b) but for a different platen thickness;

FIGS. 10(a) and 10(b) are graphs of electrostatic force as a function of time further illustrating the electrostatic chuck platen of the present invention;

FIGS. 11(a) and 11(b) are graphs of electrostatic force as a function of applied voltage further illustrating the electrostatic chuck platen of the present invention;

FIGS. 12(a) and 12(b) are graphs of electrostatic force in the shear direction as a function of applied voltage further illustrating the electrostatic chuck platen of the present invention; and FIG. 13 is a block diagram illustrating a method for making the platen according to the present invention.

DETAILED DESCRIPTION OF THE ILLUSTRATED EMBODIMENT

Figure 1:
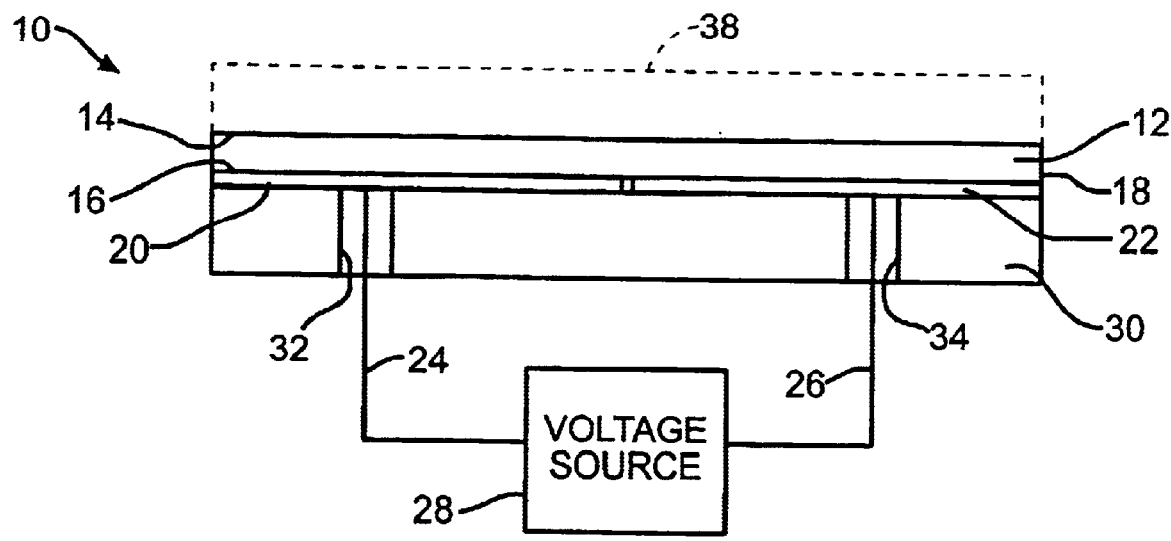
FIG. 1 is a schematic elevational diagram of an electrostatic chuck including a platen according to the present invention.
Figure 2:
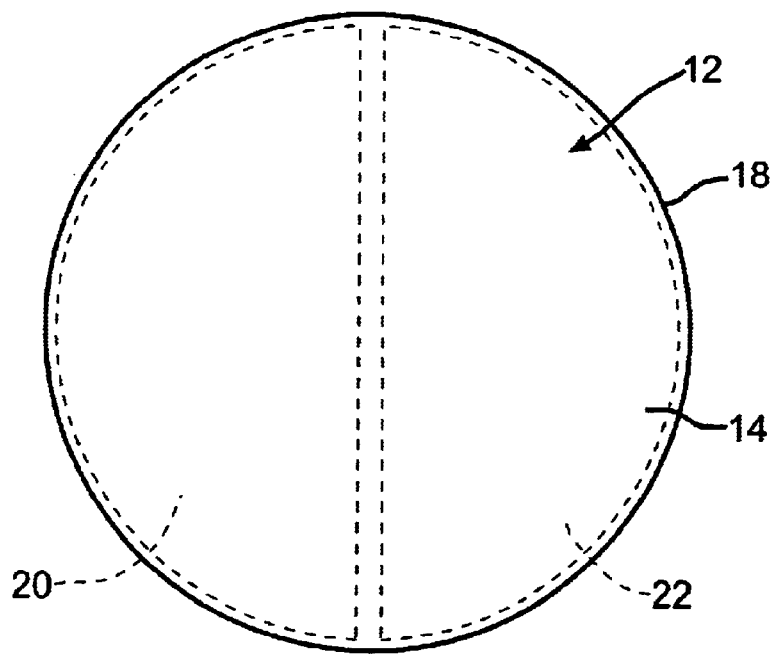
FIG. 2 is a schematic plan diagram of the platen of FIG. 1.

FIG. 1 illustrates a basic electrostatic chuck 10 including a platen 12 according to the present invention. Platen 12 is of dielectric material which will be described in further detail presently and has upper 14 and lower 16 surfaces as shown in FIG. 1. The periphery 18 of platen 12 can be circular as shown in FIG. 2 so that platen 12 has the overall shape of a disc. A pair of electrodes 20 and 22 are in contact with the lower surface 16 of platen 12. Electrodes 20 and 22 are attached to surface 16 in a suitable manner and are connected by leads 24 and 26 to a voltage source 28. The number and shape of electrodes is purely a matter of design choice. Platen 12 with electrodes 20, 22 in contact therewith is supported on a backing plate 30 of electrically insulating material. Leads 24 and 26 extend through openings 32 and 34, respectively, in backing plate 30. A semiconductor wafer 38 to be processed is supported on platen upper surface 14 as shown in FIG. 1. When it is desired to hold wafer 38 firmly in place for processing, voltage source 28 is operated to apply an electrostatic attractive force between wafer 38 and platen 12 sufficient to maintain wafer 38 in position on the chuck 10. After processing of wafer 38 is completed, voltage source 28 is deactivated to allow release and removal of wafer 38 from chuck 10. Such operation of electrostatic chucks is well known to those skilled in the art.

Platen 12 according to the present invention is characterized by a new material in the form of an insulator body or layer of $Al_2O_3$ or like insulating materials in which carbonated, nitrified transition metals and/or conductive carbonated grains are diffused, namely a combined ceramic material for the platen of an electrostatic chuck. This is illustrated in FIGS. 3(a)–3(d) which are scanning electron microscope photographs of $Al_2O_3$–TiC composites according to the present invention in which the volume fraction of TiC was varied from 2.5 to 15%.

The present invention provides an E-chuck platen having the dielectric layer of $Al_2O_3$ in which the grains made out of conductive material are diffused with the volume content of 2.5 to 15%, one of a very typical hard ceramic combined material. $Al_2O_3$–TiC preferably is utilized for the E-chuck platen material. The material ($Al_2O_3$–TiC) has excellent mechanical characteristics and electrostatic clamping capabilities.

The electrostatic chuck platen 12 according to the present invention has a relatively large electrostatic capacitance due to the diffusion of the conductive grains as described above. This is illustrated in the table of FIG. 4 which displays electrical characteristics of the $Al_2O_3$–TiC composite material of platen 12. In the E-chuck platen 12 according to the present invention the conductive grains are well diffused around the boundaries of multi-crystallized $Al_2O_3$ to virtually widen the electrode area to increase the electrostatic capacitance. Proportional to the increase of the electrostatic capacitance, the virtual relative dielectric constant in the case of $Al_2O_3$–TiC is increased by 24% of TiC and by 35% with adding 5% of TiC respectively.

The increased electrostatic capacitance of platen 12 according to the present invention results in an Echuck platen in which clamping force is substantially increased. The E-chuck platen 12 of the invention achieves substantially high clamping force due to the increase of the amount of electrostatic charge. In case of $Al_2O_3$–TiC, the clamping force of a platen having 0.3 mm thickness at 1,500V DC is 44 g/cm$^2$ and 28 g/cm$^2$ at 1,500V AC p-p respectively, which are 60% and 100% increases of clamping force as compared to the clamping force of $Al_2O_3$ platen which does not contain TiC. This is illustrated by the curves 50 and 52 in FIG. 5 which is a graph of electrostatic force as a function of TiC content in dielectric composites. DC voltage of 1,500V and AC voltage of 1,500V (V p-p) were applied in air. The thickness of the dielectric layer is 0.3 mm.

The electrostatic chuck platen 12 of the present invention advantageously provides substantially strong wafer clamping force regardless of the ambient humidity. The curves 60 and 62 of FIG. 6(a) show electrostatic force as a function of applied DC voltage, and the curves 64 and 66 of FIG. 6(b) show electrostatic force as a function of applied AC voltage (root mean square value). The data of FIGS. 6(a) and 6(b) is for platen 12 comprising $Al_2O_3$+TiC 5% in air (relative humidity of 46%) or in $N_2$ (relative humidity of 46%). The thickness of platen 12 from which the foregoing information is derived is 0.3 mm. Thus, the invention provides an electrostatic chuck platen 12 in which clamping force is high enough to clamp a wafer under the relative humidity range of from about 2 percent to about 40 percent.

The platen 12 of the present invention has the additional feature that the voltage applied to the platen for the purpose of obtaining a wafer clamping force can be reduced by reducing its dielectric layer thickness. The curve 70 of FIG. 7(a) shows electrostatic force of platen material of $Al_2O_3$+TiC 5% of 0.3 mm thickness as a function of applied voltage. Curve 72 of FIG. 7(b) shows electrostatic force of the same platen material of 0.1 mm thickness as a function of applied voltage. Thus, the platen achieves the same amount of clamping force with applied voltage of as low as 600 V and with the dielectric layer having the thickness of 0.1 mm.

The electrostatic chuck platen 12 of the present invention advantageously has virtually no residual voltage on it. In particular, by reducing the thickness of the dielectric layer of the platen to the thickness of 0.1 mm, the residual surface potential on the platen in accordance with the sequence of the applied voltage increase and/or decrease does not remain on the platen. This is illustrated by the graphs of FIGS. 8 and 9.

FIGS. 8(a) and 8(b) show surface potential as a function of applied voltage in air for $Al_2O_3$+TiC 5% platen material of the invention having a thickness of 0.3 mm. The wafer of silicon was peeled from the platen after application of voltage to the electrostatic chuck device. Curve 84 illustrates the surface potential vs. applied voltage characteristic with peel off at +1000 volts, and curve 86 illustrates the characteristic with peel off at −1000 volts. FIGS. 9(a) and 9(b) show surface potential as a function of applied voltage in air for $Al_2O_3$+TiC 5% platen material of the invention having a thickness of 0.1 mm. The wafer of silicon was peeled from the platen after application of voltage to the electrostatic chuck device. Curve 88 illustrates the surface potential vs. applied voltage characteristic with peel off at +600 volts, and curve 90 illustrates the characteristic with peel off at −600 volts.

The platen 12 according to the present invention has a very fast wafer releasing capability due to the previously described fact that the voltage applied to platen 12 to obtain wafer clamping force can be reduced by decreasing the dielectric layer thickness. Wafer release can be accomplished in less than one second duration and the residual clamping force can be reduced by approximately 60% as compared to the wafer platen in which the dielectric layer thickness is not reduced. The graphs of FIGS. 10(a) and 10(b) show electrostatic force as a function of time wherein curves 94 and 96 represent the release response of an electrostatic chuck having a platen 12 according to the present invention of 0.3 mm thickness and 0. 1 mm thickness, respectively. The applied voltage was turned off at time=0 seconds. The faster release response with platen 12 of reduced thickness is evident.

The platen 12 of the present invention with the additional feature of reduced thickness provides a wafer clamping force having the same strength by either applying a DC voltage or an AC voltage of root mean square magnitude that is equal to that DC voltage. The graphs of FIGS. 11(a) and 11(b) show electrostatic force as a function of applied voltage wherein curve 100 is for DC voltage and curve 102 is for AC voltage (root mean square value). Both are for an electrostatic chuck having platen 12 of $Al_2O_3$+TiC 5% with a thickness of 0.1 mm. As shown by the graphs, the platen 12 generates a 20 g/cm$^2$ wafer clamping force at an applied DC voltage of 400V and/or applied voltage of 400Vrms to the platen.

The platen 12 of the present invention with the additional feature of reduced thickness has less force reduction ratio on the shear force as compared to the normal force, i.e. the force in a direction perpendicular to surface 14. Curves 106 and 108 in FIGS. 12(a) and 12(b), respectively, show electrostatic force in the shear direction for a platen 12 of $Al_2O_3$+ TiC 5% with thickness of 0.1 mm as a function of applied DC voltage and applied AC voltage (root mean square value), respectively. The platen has a 66% component of shear force with an applied DC voltage and a 32% component of shear force with an applied AC voltage as compared to each normal force with the same DC voltage and AC voltage respectively.

In addition to the foregoing attributes of platen 12 of the present invention, the addition of TiC provides the following desirable characteristics of platen 12. One is higher hardness. The hardness of $Al_2O_3$–TiC (30% TiC concentration) at 500 degree C. on Vickers Hardness Scale is approximately 1800, whereas $Al_2O_3$ itself under the same conditions is 1600. Thus $Al_2O_3$–TiC is harder by 16% as compared to $Al_2O_3$. The increase of the hardness contributes to the less weariness characteristic of the aforementioned wafer platen and/or less generation of the contamination in a clean room environment due to less worn characteristic of the material.

Another desirable characteristic is a higher temperature transfer characteristic. The heat transfer ratio of $Al_2O_3$–TiC (30% concentration) is approximately 21 W/mK, whereas $Al_2O_3$ itself under the same conditions is 17W/mK. Thus $Al_2O_3$–TiC has a better heat transfer characteristic by 24% as compared to $Al_2O_3$. Better heat transfer characteristic contributes to a clamped wafer the equal distribution of the heat over entire surface of the water.

Still another desirable characteristic is higher anti-breaking force. The anti breaking force of $Al_2O_3$–Tic (30% TiC concentration) is 700 to 800 MPa, whereas $Al_2O_3$ itself under the same conditions is 400 to 500 Mpa. Thus $Al_2O_3$–TiC has stronger anti-breaking force characteristic by 60 to 70% as compared to $Al_2O_3$. Better anti breaking force characteristic contributes to the strength of aforementioned platen.

The platen 12 of the present invention also has good anti-rusting, anti-plasma and anti-heat characteristics.

FIG. 13 illustrates a method for making the platen according to the present invention. At the beginning stages 120 and 122 of the method dielectric ceramic material and electrically conductive material, respectively, are provided. Preferably the dielectric ceramic material is alumina ceramic powder of grain size about 0.2 μm, and preferably the electrically conductive ceramic material is titanium carbide ceramic powder having a grain size of about 0.5 μm and being present in an amount of from about 2.5 % to about 15.0 % by volume. The two materials then are mixed in a solvent during stage 124 preferably ethanol and for a time of about 72 hours. The resulting mixture is allowed to dry during stage 126. The figuration stage 128 involves forming or shaping the dried mixture in a mold or the like. The resulting shape is that which is desired for the platen, preferably in the form of a disc. Then in the next stage 130 the platen is sintered at a temperature of about 1600° C. under pressure of about 20 MPa and for about one hour. This is done by a conventional hot-press process. After sintering there is a grinding and polishing stage 132, primarily on the surface of the platen which will contact the semiconductor wafer. The thickness of the resulting platen can range from about 0.1 mm to about 2.0 mm, depending upon the application. Stage 134 represents the completed platen, in the form of a mono-layered structure.

While an embodiment of the present invention has been described in detail, that has been done for the purpose of illustration, not limitation

What is claimed is:

1. A platen for electrostatic wafer clamping apparatus comprising:
   a) a platen body of dielectric material; and
   b) grains of electrically conductive material diffused in the dielectric material in an amount of from about 2.5 percent to about 15.0 percent of the volume of the platen body.

2. The platen according to claim 1, wherein the dielectric material comprises $Al_2O_3$.

3. The platen according to claim 1, wherein the grains of electrically conductive material are selected from the group consisting of carbonated transition metals, nitrified transition metals and carbonated grains.

4. The platen according to claim 1, wherein the dielectric material comprises $Al_2O_3$ and the grains of electrically conductive material comprise TiC.

5. The platen according to claim 1, wherein TiC is present in an amount of about 5.0 percent of the volume of the platen body.

6. A platen for electrostatic wafer clamping apparatus comprising:
   a) a platen body of dielectric material having a predetermined thickness;
   b) grains of electrically conductive material diffused in the dielectric material; and
   c) so that the platen has a relatively large electrostatic capacitance due to the diffusion of the conductive grains with the result that the platen provides an increased clamping force regardless of ambient humidity.

7. The platen according to claim 6, wherein the thickness of the platen body is decreased by an amount sufficient to provide the same amount of clamping force with a reduced magnitude of applied voltage.

8. The platen according to claim 6, wherein the thickness of the platen body is reduced by an amount sufficient to eliminate any residual voltage on the platen.

9. The platen according to claim 6, wherein the thickness of the platen body is reduced by an amount sufficient to increase the speed of wafer release.

10. A platen for electrostatic wafer clamping apparatus comprising a platen body of $Al_2O_3$ dielectric material having grains of electrically conductive TiC diffused therein.

11. The platen according to claim 10, wherein the grains of TiC are present in an amount of about 5 percent of the volume of the platen body.

12. The platen according to claim 10, wherein the platen body has a thickness of about 0.3 mm.

13. The platen according to claim 10, wherein the platen body has a thickness of about 0.1 mm.

14. A method of making a platen for electrostatic wafer clamping apparatus comprising:
   a) mixing dielectric ceramic material and electrically conductive ceramic material in a solvent;
   b) drying the resulting mixture;
   c) forming the resulting mixture into the shape of a platen; and
   d) sintering the shaped product.

15. The method according to claim 14, wherein the dielectric ceramic material comprises alumina ceramic power and the conductive ceramic material comprises titanium carbide ceramic powder.

16. The method according to claim 15, wherein the solvent is ethanol.

17. The method according to claim 15, wherein the sintering is performed at a temperature of about 1600° C.

18. The method according to claim 15, further includes grinding and polishing the resulting product after sintering.

* * * * *

UNITED STATES PATENT AND TRADEMARK OFFICE
CERTIFICATE OF CORRECTION

PATENT NO.    : 6,660,665 B2
DATED         : December 9, 2003
INVENTOR(S)   : Hiroaki Yanagida et al.

It is certified that error appears in the above-identified patent and that said Letters Patent is hereby corrected as shown below:

<u>Title page,</u>
Item [*] Notice, should read as follows: -- Subject to any disclaimer, the term of this patent is extended or adjusted under 35 U.S.C. 154(b) by 0 days. --

Signed and Sealed this

Tenth Day of February, 2004

JON W. DUDAS
*Acting Director of the United States Patent and Trademark Office*